United States Patent [19]

Josephs

[11] 4,177,297

[45] Dec. 4, 1979

[54] MAGNETIC BUBBLE LATTICE DEVICE

[75] Inventor: Richard M. Josephs, Willow Grove, Pa.

[73] Assignee: Sperry Rand Corporation, New York, N.Y.

[21] Appl. No.: 765,157

[22] Filed: Feb. 4, 1977

Related U.S. Application Data

[63] Continuation of Ser. No. 618,868, Oct. 2, 1975, abandoned.

[51] Int. Cl.² ............................................. H01F 10/02
[52] U.S. Cl. ..................................... 427/38; 427/128; 427/129; 427/130
[58] Field of Search ..................................... 427/38–40, 427/48, 127–132

[56] References Cited

U.S. PATENT DOCUMENTS

| 3,930,241 | 12/1975 | Guarnieri et al. | 340/174 TF |
| 3,932,688 | 1/1976 | Sugita et al. | 428/336 |
| 3,996,577 | 12/1976 | Hsu | 340/174 EB |

OTHER PUBLICATIONS

Hoshikawa et al., Japan J. Appl. Phys., vol. 13 (1974), No. 12, *A New Method . . . Garnet Films*.

Primary Examiner—Bernard D. Pianalto
Attorney, Agent, or Firm—Rene A. Kuypers

[57] ABSTRACT

The disclosure teaches how binary information may be stabilized in magnetic bubble lattice devices. In bubble lattice devices, information storage is determined by the state of the domain wall structure of the bubble. Fabrication means are disclosed for stabilizing two different types of bubbles found in such films.

9 Claims, 4 Drawing Figures

MAGNETIC BUBBLE LATTICE DEVICE

This is a continuation of application Ser. No. 618,868 filed Oct. 2, 1975 and now abandoned.

BACKGROUND OF THE INVENTION

1. Field of the Invention

This invention relates in general to the field of bubble memory devices, and in particular to bubble memory devices of the lattice type.

2. Description of the Prior Art

In magnetic bubble lattice devices wherein information is stored in the domain wall structure of the bubble, the two information states representing "1" and "0" are represented by the presence or absence of a pair of Bloch lines. For purposes of this discussion, Bloch lines may be defined as a transition zone through which the magnetization at the center of the domain wall reverses direction. For reliable information storage, both states must be equally stable.

In conventional prior art bubble lattice devices such as disclosed in U.S. 3,996,577 magnetic garnet films are grown on oriented substrates and are ion implanted (i.e., the film surface has been bombarded and implanted with ions). In such films, only one stable information state can be obtained. In order to obtain the second information state, an appropriate external in-plane field must be applied. The presence of the in-plane field has the effect of stabilizing this second information state without destroying the first state. If the in-plane field were not present, one information state would be overwhelmingly more stable than the other state.

The requirement of an external in-plane field is an undesirable characteristic of the known prior bubble lattice devices since it requires additional fabrication steps or hardware. This results from the facts that additional conductors must be deposited on the substrate or a set of external field coils must be included. The conductor or external coils are an added cost because of the additional circuitry required to be connected thereto in order to energize it at the proper time.

SUMMARY OF THE INVENTION

Broadly, the invention employs a process for stabilizing $S=0$ and $S=1$ type bubbles in magnetic lattice devices wherein S is defined as the number of times the magnetic spin at the center of a domain wall turns through $2\pi$ radians. Process means are disclosed for providing bubbles of this type in a zero in-plane field.

DESCRIPTION OF THE PREFERRED EMBODIMENTS

Figure 1A:
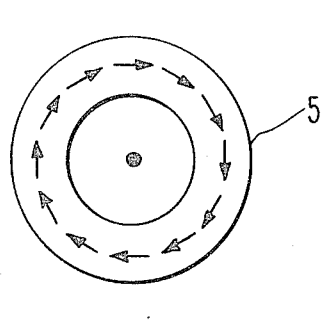
FIGS. 1(a) and (b) depicts the domain wall arrangement of the $S=1$ and $S=0$ lattice type bubbles.

Referring now to FIGS. 1(a) and (b) in greater detail there is shown the domain walls of two different types of bubbles found in bubble lattice devices. At the center of each domain wall are depicted the magnetic spins associated with each different type of bubble. S is called the revolution number and identifies the number of times the magnetic spin at the center of the domain wall turns through $2\pi$ radians as the complete wall is traversed. FIG. 1a depicts an $S=1$ bubble 5 since the magnetic spin undergoes a net change of direction of $2\pi$ radians. The dot inside the domain wall indicates that the magnetization is pointed outwardly from inside the bubble. The $S=1$ type bubble is considered the simplest bubble configuration and because the magnetic spin is slowly re-oriented, around the center of the domain wall, the energy to form this domain wall structure is a minimum.

Figure 1B:
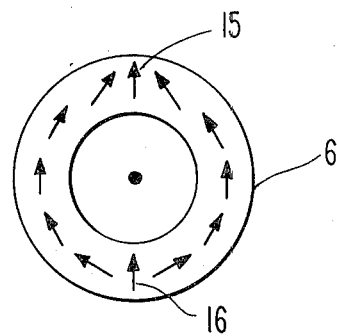

The $S=0$ bubble type 6 shown in FIG. 1(b) indicates that there is no net rotation as the spin is followed completely around the center of the wall. This spin configuration has a higher energy than that of the $S=1$ bubble accounting for the difference is stability.

The two binary states of "1" and "0" are represented by the absence or presence of a pair of Bloch lines. One state is represented by the presence of an identical pair of Bloch lines shown in FIG. 1(b), whereas the second state is represented by the absence of such a pair of Bloch lines as seen in FIG. 1(a).

Figure 2:
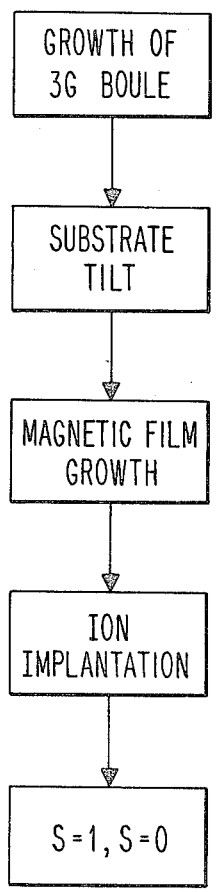
FIG. 2 is a block diagram of the process steps which are utilized with this invention.
Figure 3:
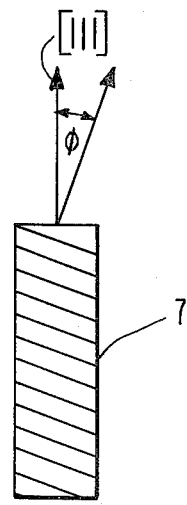
FIG. 3 is a boule (cylinder) of a 3G garnet substrate material.

Referring now to FIG. 2, there is shown the process steps that are utilized in arriving at the bubble memory which is the subject of this invention. The first process step consists in synthesizing the non-magnetic substrate, which in the present embodiment is comprised of a gadolinium gallium garnet, $Gd_3Ga_5O_{12}$ (hereinafter 3G) by forming a cylindrical boule 7 of such material as seen in FIG. 3.

The boule 7 is formed in a conventional manner by slowly rotating a 3G seed having a cubic crystallographic structure in a melt of $Gd_3Ga_5O_{12}$ over a long period of time. Eventually, a boule will be formed from which substrates can be obtained by slicing at the desired angle.

The boule 7 is grown so that its longitudinal axis is along the [111] direction. The [111] direction defines the diagonal of the cube which has one unit of distance respectively in the x, y, z direction. Therefore, the diagonal of the cubic garnet crystals which comprise the boule cylinder 7 are along the longitudinal axis.

The next step in the process of this invention comprises intentionally tipping the [111] direction. This is readily achieved for slicing the boule at an angle, as shown in FIG. 3 into substrates of useable thickness. In the preferred embodiment of this invention the [111] direction has been tipped by approximately 4 degrees from the normal. This is accomplished by slicing the boule 7 at the 4 degree angle with respect to the [111] growth direction. The typical substrate size is from 1-2 inches in diameter, and from 10-20 mils thick.

Referring again to FIG. 2 it is seen that the process step comprises depositing the magnetic bubble film on the tilted substrate. A magnetic garnet bubble film is deposited by a known process on the nonmagnetic garnet substrate. In the preferred embodiment of this invention the bubble material used is $Y_{2.38}La_{0.09}Eu_{0.53}Fe_{3.9}Ga_{1.1}O_{12}$ (Yttrium, Lanthanium, Europium, Iron, Gallium Garnet).

The magnetic bubble material is deposited on the non-magnetic substrate by the well-known liquid phase epitaxy process (i.e., the magnetic film assumes the same crystallographic structure as the substrate, i.e., cubic). Liquid phase epitaxy is accomplished, for example, by dissolving oxides of the various metal and rare earth ions that are desired in the garnet film. Enough oxides are dissolved so that the solution becomes supersaturated (a solution containing more solid than the quantity that can be dissolved normally at a given temperature) and then the solution is supercooled (cooling the liquid below its freezing point without causing solid matter to separate). At this point, the nonmagnetic 3G substrate is lowered into the melt. It is rotated around the vertical axis at about 100 RPM and epitaxial growth occurs provided the proper concentration of the various oxides exist in the supercooled melt.

It has been found that films grown on tilted substrates have their EASY axis tipped several times as much as the substrate tilts. It has been found that a 4 degree substrate tilt produces a 22 degree tilt of the bubble film's EASY axis. Therefore, there is a component of the EASY axis in the plane of the substrate.

FIG. 2 indicates that after the tilted magnetic bubble film has been deposited on the substrate, it is implanted with ions. Ion implantation is the technique of shooting electrically charged atoms formed when neutral atoms gain or lose an electron into the surface of the bubble film. The ions are shot into the bubble surface a distance of 1,000 Å. The implanted ions cause the bubble film to develop strains in its upper layer. Since the films are magnetostrictive (i.e., a change in magnetic properties produced by mechanical stress), the implanted ions cause a compressive stress in the upper layer of the film. This causes the surface magnetization to be oriented in the plane of the film instead of pointing normal to the film.

In summary, by ion implanting the tilted bubble films as above described, two stable bubble types (i.e., $S=0$ and $S=1$) are present in a zero in-plane field arrangement. The $S=1$ bubble is a type that is normally found in ion-implanted conventional films. The $S=0$ bubble is a type which is stabilized by the combination of the in-plane magnetization of the implanted layer and the in-plane component of the growth induced anisotropy (arising due to a preferential ordering of the rare earth ions Y, $L_a$, Eu) which arises from the EASY axis tilt.

What is claimed:

1. The method of fabricating magnetic domain wall structures of a bubble lattice and stabilizing same comprising:
    a. forming a non-magnetic substrate material having a preferred crystallagraphic axis;
    b. tilting said substrate by an angle with respect to said preferred crystallographic axis;
    c. depositing a magnetic bubble material on said tilted substrate; said material incorporating more than two bubble types wherein each has different said magnetic domain wall structures,
    d. implanting ions into the surface of said magnetic bubble material
    e. to provide two stable said domain wall types in the bubble lattice to define different binary information;
    f. said two domain wall types being stabilized without use of an external in-plane field.

2. The method in accordance with claim 1 wherein said forming step comprises the forming of a gadolium, gallium garnet.

3. The method in accordance with claim 1 wherein said tilting step comprises tilting said substrate with respect to said preferred crystallographic axis by approximately four degrees.

4. The method in accordance with claim 1 wherein said depositing steps comprises depositing $Y_{2.38}L_{0.09}Eu_{0.53}Fe_{3.9}Ga_{1.1}O_{12}$ on said tilted substrate whereby $S=0$ and $S=1$ bubbles are stabilized.

5. The method in accordance with claim 1 wherein in said implanting step, the ions are implanted approximately 1,000 Å.

6. The method of fabricating magnetic domain wall structures of a bubble lattice device and stabilizing same comprising:
    a. forming a non-magnetic substrate material having a preferred crystallographic axis;
    b. tilting said preferred crystallographic axis of said substrate by an angle with respect to said preferred crystallographic axis;
    c. depositing a magnetic bubble material on said tilted substrate, said material incorporating more than two different domain wall structures, and an EASY axis tilted at a greater angle than the tilt of said preferred crystallographic axis to provide an in-plane component of a growth induced anisotropy;
    d. implanting ions into the surface of said magnetic bubble material to produce an in-plane magnetization to provide one stable domain wall structure of said bubble lattice;
    e. a second stable domain wall structure of said bubble lattice being provided by the combination of the in-plane magnetization of the ion implanted surface and the in-plane component of the EASY axis tilt;
    f. said two domain wall structures being stabilized without use of an external in-plane field.

7. The method in accordance with claim 6 wherein said preferred crystallographic axis of said substrate is tilted at an angle of approximately four degrees and said EASY axis is tilted at approximately twenty-two degrees.

8. The method in accordance with claim 1 wherein said different information is binary information.

9. The method in accordance with claim 6 wherein said first and second stable domain wall structures provide binary states of information.

* * * * *